United States Patent
Chen et al.

(10) Patent No.: US 6,541,329 B1
(45) Date of Patent: Apr. 1, 2003

(54) METHOD FOR MAKING AN ACTIVE PIXEL SENSOR

(75) Inventors: Chong-Yao Chen, Chang Hua (TW); Chen-Bin Lin, Taipei (TW); Feng-Ming Liu, Chu-Pei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/682,477

(22) Filed: Sep. 7, 2001

(51) Int. Cl.⁷ .......................................... H01L 21/8234
(52) U.S. Cl. ....................... 438/237; 438/200; 438/232; 438/306
(58) Field of Search ................................ 438/200, 213, 438/231, 232, 237, 286, 301, 305, 306, 527, 942

(56) References Cited

U.S. PATENT DOCUMENTS

| | | | | |
|---|---|---|---|---|
| 5,625,210 A | * | 4/1997 | Lee et al. ..................... | 257/233 |
| 6,040,593 A | * | 3/2000 | Park ............................ | 257/233 |
| 6,180,969 B1 | * | 1/2001 | Yang et al. .................. | 257/291 |
| 6,184,055 B1 | * | 2/2001 | Yang et al. .................. | 257/233 |
| 6,258,645 B1 | * | 7/2001 | Kang ........................... | 438/224 |
| 6,329,233 B1 | * | 12/2001 | Pan et al. .................... | 438/199 |
| 6,403,998 B1 | * | 6/2002 | Inoue ........................... | 257/292 |

* cited by examiner

Primary Examiner—Amir Zarabian
Assistant Examiner—Jamie L. Brophy
(74) Attorney, Agent, or Firm—Winston Hsu

(57) ABSTRACT

A plurality of active pixel sensors are formed on the surface of a semiconductor wafer. The semiconductor wafer comprises a P-type substrate, an active pixel sensor region and a periphery circuit region. A first active pixel sensor block mask (APSB mask) is formed to cover the active pixel sensor region, then at least one N-well on the surface of the semiconductor wafer not covered by the first APSB mask is formed. A second APSB mask and at least one N-well mask are formed to cover the active pixel sensor region and the region outside the P-well region. At least one P-well on the surface of the semiconductor wafer not covered by the second APSB mask and the N-well mask is formed. Finally, at least one photodiode and at least one complementary metal-oxide semiconductor (CMOS) transistor are formed on the surface of the active pixel sensor region.

17 Claims, 12 Drawing Sheets

METHOD FOR MAKING AN ACTIVE PIXEL SENSOR

BACKGROUND OF THE INVENTION

1. Field of the Invention

The present invention provides a method for making an active pixel sensor, especially an active pixel sensor with a photodiode having an increased quantum efficiency (QE).

2. Description of the Prior Art

An active pixel sensor is a semiconductor device comprising an N-type channel metal-oxide semiconductor (NMOS) transistor, or a complementary metal-oxide semiconductor (CMOS) transistor, and a photodiode. It is commonly used as an image sensor for a photoelectric product, such as a camcorder or a scanner.

In current semiconductor processes, the metal-oxide semiconductor device in the active pixel sensor, the active pixel sensor region including photodiode, and the periphery circuit which includes other devices, are all made on a single chip. The periphery circuit not only comprises a plurality of CMOS transistors composed of an N-type channel metal-oxide semiconductor (NMOS) device and a P-type channel metal-oxide semiconductor (PMOS) device, but also comprises devices like resistors and capacitors. In the image sensor fabrication process, the CMOS transistors in the periphery circuit, the N-type channel metal-oxide semiconductor device, and the photodiode in the active pixel sensor region all need to be integrated together. Therefore, an N-well ion implantation process in a typical CMOS transistor process is used as the first ion implantation process in the fabrication process of an image sensor chip.

Please refer to FIG. 1. FIG. 1 is a schematic diagram of a prior art active pixel sensor 10. A photosensing area 20 for the prior art active pixel sensor 10 is positioned on a semiconductor wafer 11. The semiconductor wafer 11 comprises a silicon substrate 12 and P-well 14 positioned on the silicon substrate 12. The active pixel sensor 10 comprises an N-type channel metal-oxide semiconductor (NMOS) transistor 16 positioned on the surface of the p-well 14, and the photosensing area 20 positioned on the surface of the P-well 14 for electrically connecting to a drain of the NMOS transistor 16. The semiconductor wafer 11 further comprises a plurality of field oxide layers 18 on the surface of the silicon substrate 12. The field oxide layers 18 surround the photosensing area 20 and serve as an insulating material to prevent short-circuiting between the photosensing area 20 and other devices.

Please refer to FIG. 2. FIG. 2 is a schematic diagram of the prior art active pixel sensor 10 with a common area shared by a drain 17 and a doping area 22. In some embodiments, the source or drain of the NMOS 16 shares a common area with the doping area 22 in the photosensing area 20 in order to shrink the area of the active pixel sensor 10. The drain 17 is a high concentration doping area ($N^+$), and the doping area 22 is a low concentration doping area ($N^-$).

As described above, the method for forming the prior art active pixel sensor 10 is to perform an N-well ion implantation process to the image sensor chip first. The N-well ion implantation process implants phosphorous ions with a dosage of approximately $10^{13}/cm^2$ into the chip by utilizing an energy ranging from 100~200 eV to form an N-well. Then, a P-well, 14 ion implantation process is performed to the active pixel sensor region in the image sensor chip to form a P-well 14, The P-well 14 ion implantation process is a high energy boron ion implantation process with a dosage slightly higher than $10^{13}/cm^2$. Since the N-well ion implantation process, which is a blanket implant process, is performed before the P-well ion implantation process to neutralize the N-well ion implantation process to form a P-well 14, the P-well ion implantation process is also called a compensation ion implantation process.

However, the two high-energy ion implantation processes usually cause damage of the single crystal structure on the surface of the P-well 14, which has drawbacks, such as increasing leakage current and inferior product reliability. Please refer to FIG. 3. FIG. 3 is a schematic diagram of an N-well and P-well ion implantation for the prior art image sensor chip 24. The relative sites for these two ion implantation processes for the chip are shown in FIG. 3A. The N-well ion implantation process is performed to the whole image sensor chip 24. That is, the diagonal line region in FIG. 3A, which includes the whole active pixel sensor area 26. An area covered by an N-well mask is the area for forming the PMOS devices in the periphery circuit region. As shown in FIG. 3B, the P-well ion implantation process is performed to the whole image sensor chip 24 outside the N-well mask 28, that is, the diagonal line region in FIG. 3B (the P-well ion implantation region), which also includes the entire active pixel sensor area 26.

The performance of a photodiode in terms of photosensitivity is characterized by leakage current. The light-induced current (light current) in the photosensing area of a photodiode in the presence of light represents a signal, while the current (dark current) in the photosensing area of a photodiode not in the presence of light represents noise. The photodiode utilizes signal-to-noise ratios to process signal data. The method to improve the quality of a photodiode is, currently, to increase the intensity of the signal represented by the leakage current in the photosensing area in the presence of light hence increase the contrast of signal by an increased signal-to-noise ratio, in order to enhance the sensitivity of the photosensing area of the photodiode, which further improves the quality of the photodiode.

Please refer back to FIG. 1. With arsenic ions in the photosensing area 20, a depletion region 24 is formed along the PN junction between the doped region 22 and the adjacent P-well 14. The method performs an ion implantation process, utilizing a high dosage of arsenic ions as the major dopant. The ion implantation process forms an N-type ion doping area 22 on the surface of the P-well 14, so the leakage current passing through the depletion region 24 with and without light represents signal and noise, respectively. The dotted lane region marked with slanting lines in FIG. 1 illustrates the depletion region 24. Since the N-type doping area 22 in the photosensing area 20 of the photodiode 10 utilizes high dosage arsenic ions as the major dopant, the doping area 22 formed completely by heavy doping processes will cause the depletion area 24 to have a narrower width when joined with the P-well 14 to form a PN junction. This decreases the area for the actual active region in the photosensing area 20, and decreases the light current passing through the depletion region 24 when the photosensing area 20 of the photodiode 10 is in the presence of light. Furthermore, the border between the edge of the dosing area 22 underneath the field oxide layer 18 and the P-well 14 tends to have larger leakage current for the PN junction when in the dark. Noise is therefore increased, and the signal to noise ratio is worsened, decreasing the signal sensitivity of the photosensing area 20.

In order to avoid decreasing of the actual active region caused by heavy doping processes, a structure with a common area shared by the source or drain and doping area 22 is utilized to clearly improve over the structure depicted in FIG. 1. Please refer to FIG. 2. The drain 17, with a high doping concentration, is not joined with the P-well 14. Only the doping area 22, with a lower doping concentration, is directly joined with the P-well 14.

However, the wafer structure destruction problem incurred by two high energy ion implantation processes cannot be avoided in the structure of FIG. 2. Please refer to FIG. 4. FIG. 4 is a schematic diagram of a prior art partial P-well active pixel sensor 30. The photosensing area 40 of the prior art active pixel sensor 30 is positioned on a semiconductor wafer 31. The semiconductor wafer 31 comprises a silicon substrate 32, and two P-wells 33 and 34 positioned in the silicon substrate 32. The semiconductor wafer 31 further comprises two field oxide layers 35 and 36 on the surface of the silicon substrate 32. The active pixel sensor 30 comprises an NMOS 38 between the two field oxide layers 35, 36, and a photosensing area 40 formed on the surface of the silicon substrate 32 sharing a common region with a drain 39 of the NMOS 38. The two field oxide layers 35, 36 positioned on the surface of the silicon substrate 32 surround the NMOS 38 and serve as an insulating material to prevent short-circuiting between the photosensing area 40 and other devices. The drain 39 of the NMOS 38 shares a common area with the doping area 42 to shrink the areas of the active pixel sensor 30. The drain 39 is a high concentration doping area ($N^+$), and the doping area 42 is a low concentration doping area ($N^-$).

Please refer to FIG. 5. FIG. 5 is a schematic diagram of the N-well and the partial P-well ion implantation processes for the prior art image sensor chip 44. The N-well ion implantation process is performed to the active pixel sensor region 46 outside the photosensing area 40. Although there are some device regions in the periphery circuit area, such as the region for forming the NMOS, that are covered by a mask, they are not indicated in FIG. 5A. Then, as shown in FIG. 5B, the P-well ion implantation process is performed to the active pixel sensor region 46 outside the photosensing area 40. When performing the N-well and P-well ion implantation process, the photosensing area 40 is coveted by a mask.

In the structure disclosed in FIG. 4, the area occupied by the P-well is smaller, so the areas underneath the photosensing area 40 are all P-type silicon substrate 32. Therefore, destruction incurred from two high-energy ion implantation processes is avoided to resolve the drawbacks encountered in FIG. 1 and FIG. 2. In other aspects, however, new problems occurs. As shown in FIG. 4, P-well 33, 34 encroachment phenomenon may easily occur at the border between the P-well 33 and the drain 39, and at the border between the P-well 34 and the drain 39, due to a subsequent high temperature drive-in process. Once this phenomenon occurs, the actual area for photodiode shrinks. This will not only result in shrinkage of the active area, but also results in non-uniformity of the sensor area of the photosensing area 40 of different photodiodes 30, and thus leads to mismatching between different photodiodes. These are the main factors that degrade image quality.

It is therefore very important to develop an active pixel sensor with a new structure to avoid the above-mentioned wafer structure destruction problems that occur due to two high-energy ion implantation processes, and to avoid photodiode encroaching problems by the P-well. It is also desirable to form a depletion region with an adequate width and less structural defects to reduce noise and improve the absorption of red light.

SUMMARY OF THE INVENTION

It is therefore a primary objective of the present invention to provide a structure and method for making an active pixel sensor to improve the uniformity of the sensor area of the photosensing area in the photodiode, and the sensitivity of the photodiode, to resolve the above-mentioned problems.

In the preferred embodiment of the present invention, the method forms a first active pixel sensor block mask (APSB mask) to cover the active pixel sensor region first, then forms at least one N-well on the surface of the semiconductor wafer not covered by the first APSB mask. Thereafter, the first APSB mask is removed, and a second APSB mask and at least one N-well mask are formed on the surface of the semiconductor wafer to cover the active pixel sensor region and the region outside a P-well in the periphery circuit region, respectively. At least one P-well is then formed on the surface of the semiconductor wafer not covered by the second APSB mask and the N-well mask. Finally, the second APSB mask and the N well mask are removed, and at least one photodiode and at least one complementary metal-oxide semiconductor (CMOS) transistor are formed on the surface of the active pixel sensor region.

It is advantageous that the present invention first utilizes an active pixel sensor block mask to define the N-well of the PMOS transistor in the periphery circuit area, covers other portions of the wafer, and then perform the N-well ion implantation process. When making the active pixel sensor device afterwards, the P-well implantation is not performed, so the active pixel sensor device is formed on the P-type substrate. The photosensing area of the present invention photodiode is thus not surrounded by any P-well. Defects in wafer structure are reduced, the leakage current is lowered, and noise is reduced. Also, non-uniformity of sensor areas of the photosensing area of different photodiodes shows clear improvement, further improving the image quality. Under 550 nm incident light, the quantum efficiency of the present invention photodiode is raised to more than 60%.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
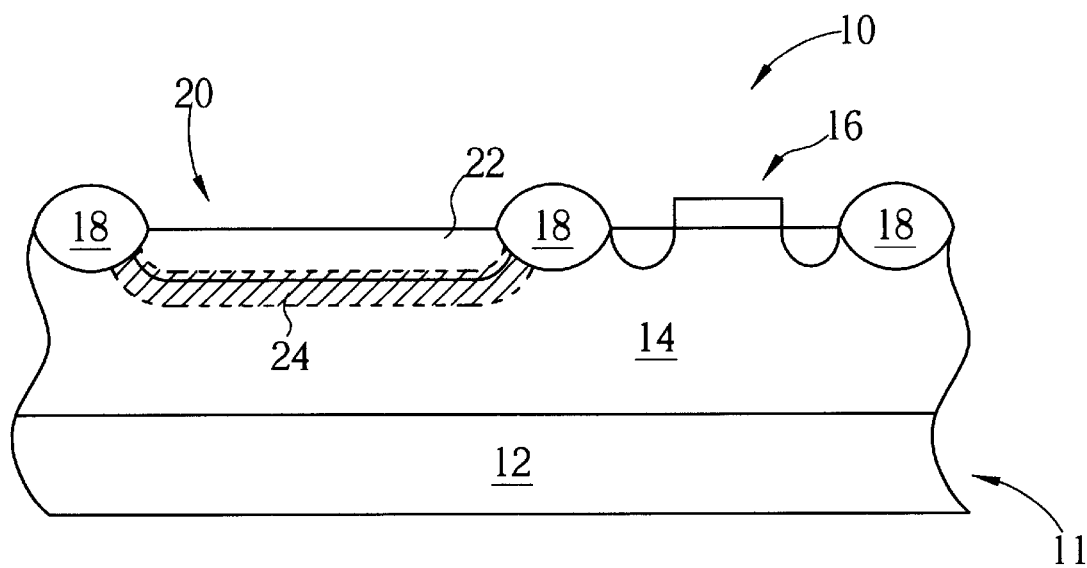
FIG. 1 is a schematic diagram of a prior art active pixel sensor.
Figure 2:
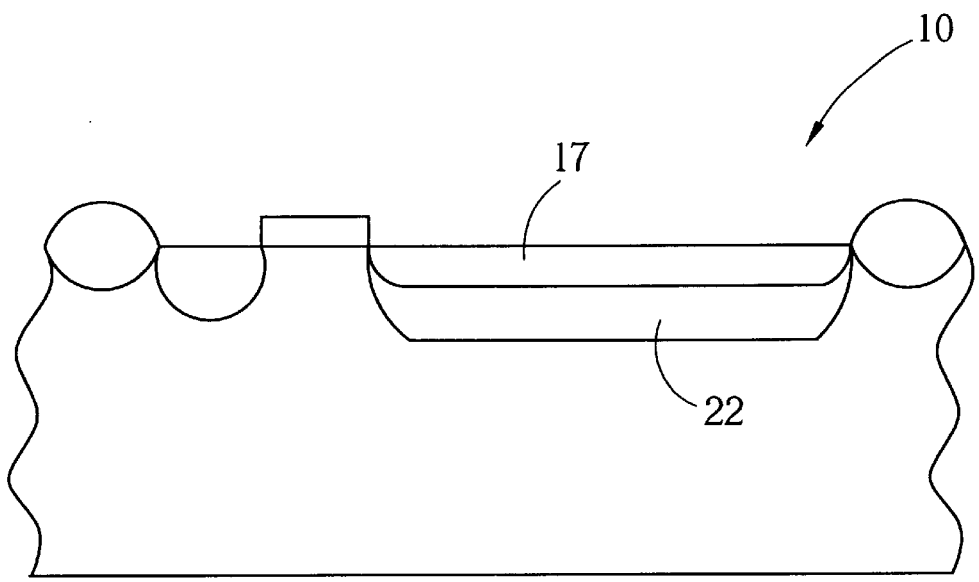
FIG. 2 is a schematic diagram of a prior art active pixel sensor with a common area shared by drain and doping areas.
Figure 3A:
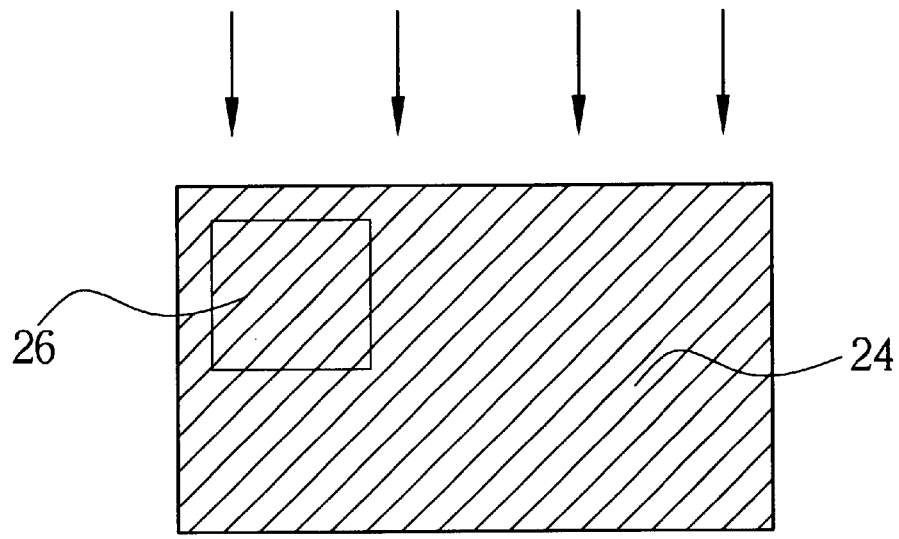
FIG. 3 is a diagram of N-well and P-well ion implantations for a prior art image sensor chip.
Figure 3B:
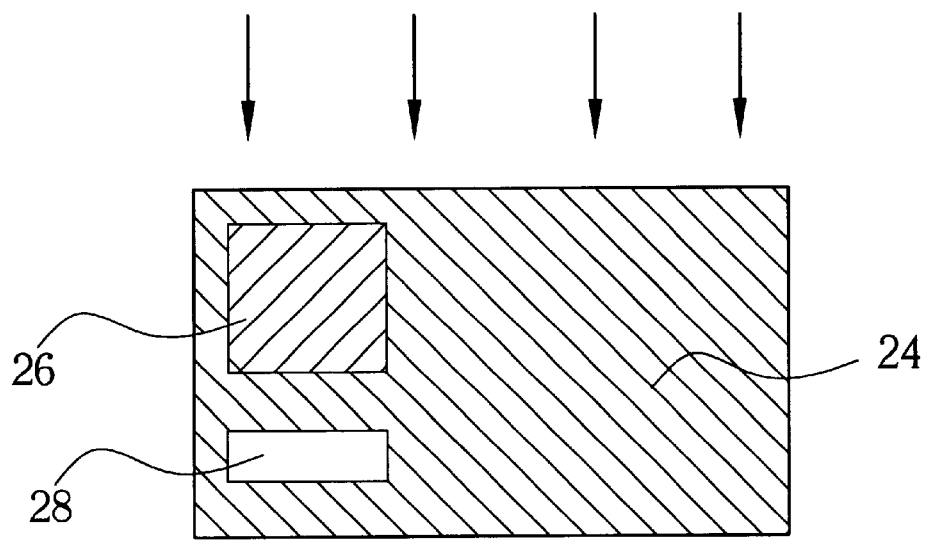
Figure 4:
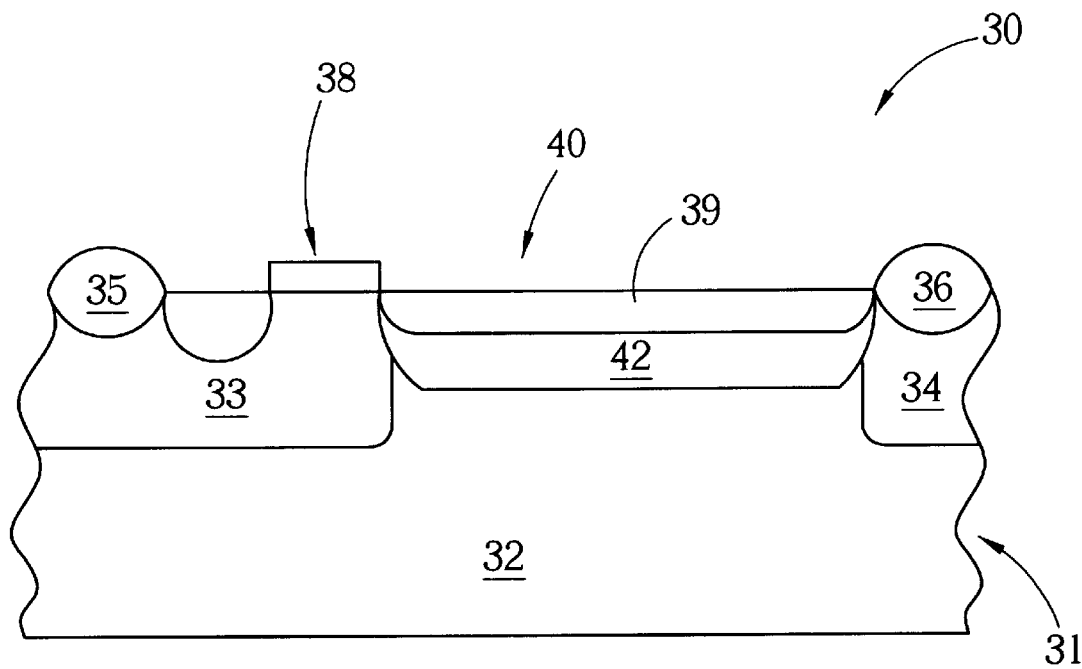
FIG. 4 is a schematic diagram of a prior art partial P-well active pixel sensor.
Figure 6:
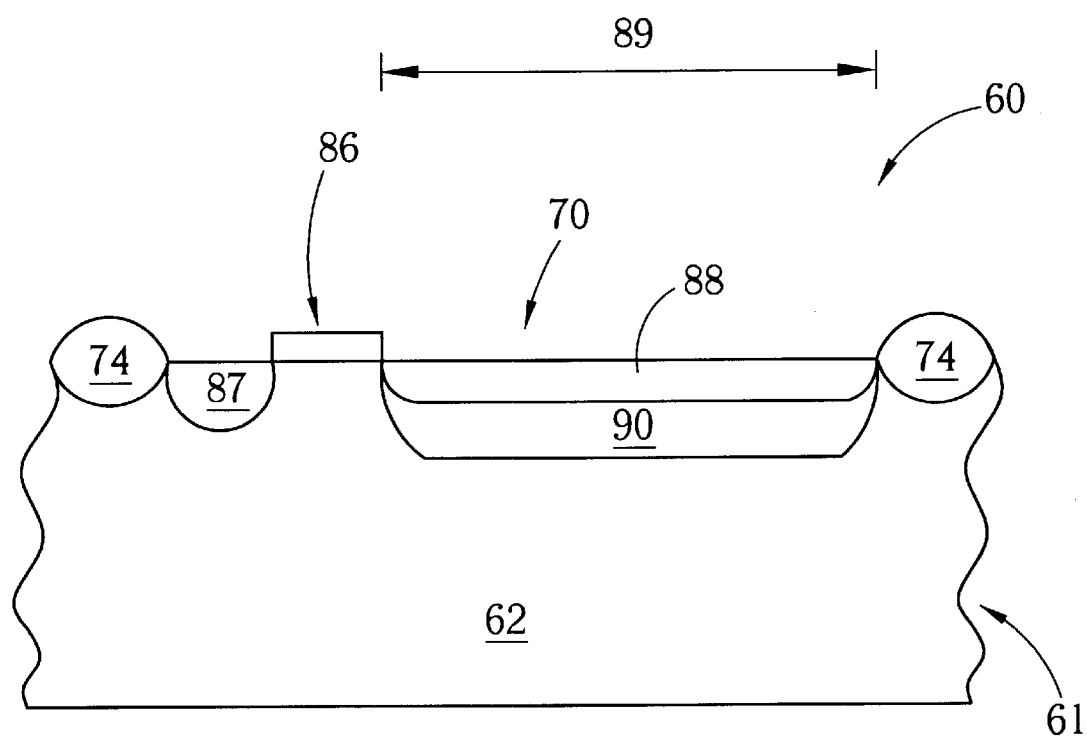
FIG. 6 is a schematic diagram of a present invention active pixel sensor.
Figure 5A:
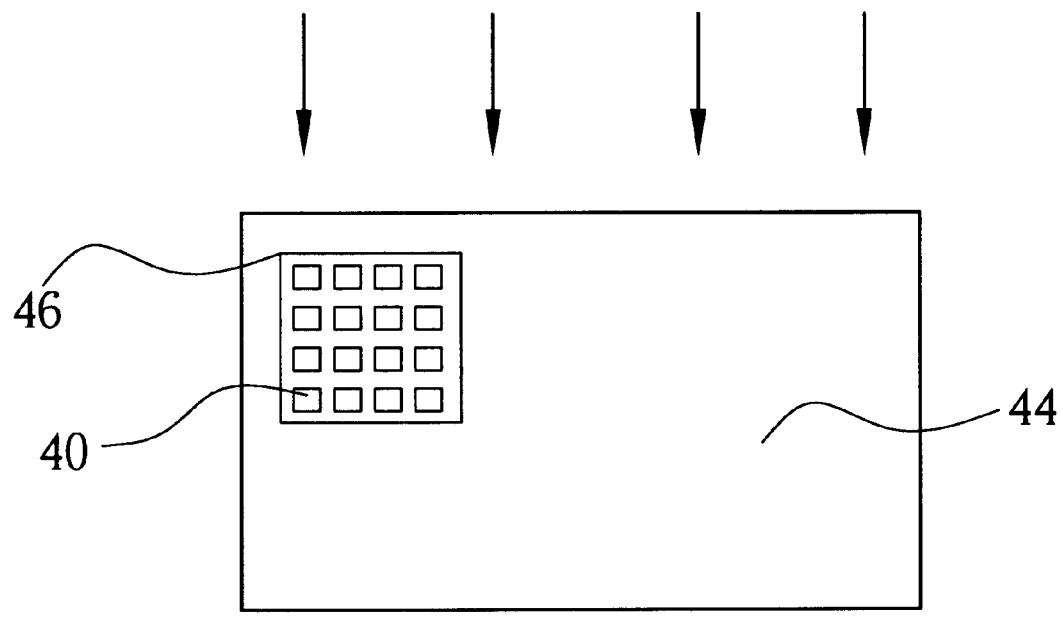
FIG. 5 is a diagram of the N-well and the partial P-well ion implantations for the prior art image sensor chip.
Figure 5B:
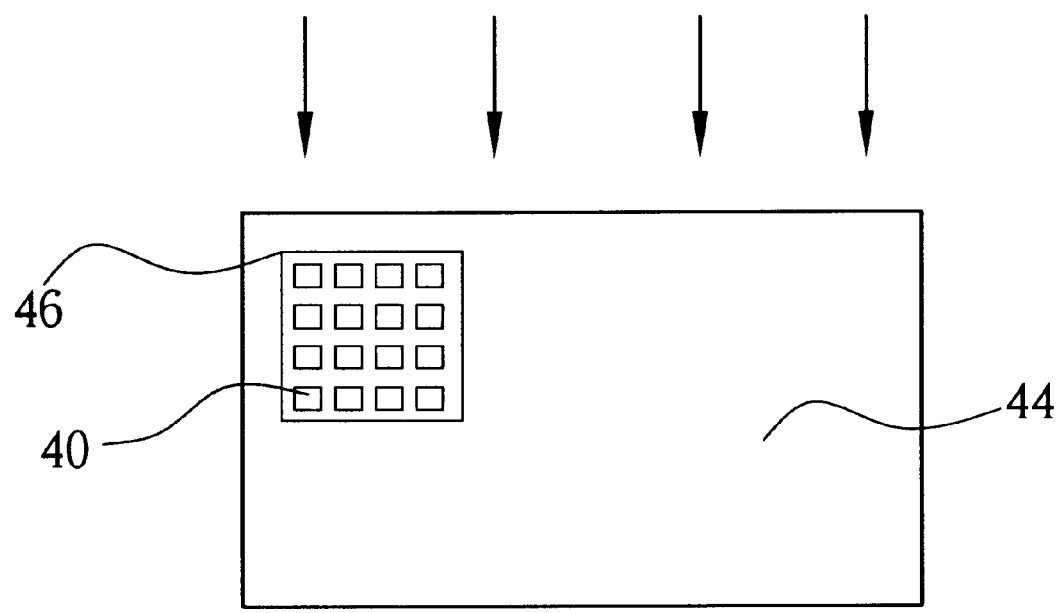

Please refer to FIG. 6. FIG. 6 is a structural schematic diagram of a present invention active pixel sensor 60. The present invention provides a photosensing area 70 in the active pixel sensor 60, and the associated fabrication method. In the following description, a semiconductor wafer 61 having a silicon substrate 62 with P-type dopants is taken as an example to illustrate the fabrication process of the photosensing area 70 in the present invention active pixel sensor 60. The semiconductor wafer 61 comprises a P-type silicon substrate 62, an active pixel sensor transistor(APS transistor) 86, a photodiode region 89, a photosensing area 70 on top of the photodiode region 89, and a field oxide layer 74 on the surface of the silicon substrate 62 that surrounds the APS transistor 86. The APS transistor 86 further comprises a source 87 and a drain 89 on the surface of the P-type silicon substrate. The drain 88 of the APS transistor 86 is a high concentration doping area ($N^+$), and the N-type sensor implantation area 90 in the photosensing area 70 on the photodiode region 89 is a low concentration doping area ($N^-$). The N-type sensor implantation area 90 utilizes phosphorous ions (P) as dopants with a dosage of $10^{12}/cm^2$, and the drain 88 utilizes phosphorous ions (P) as dopants with a dosage of $10^{14}/cm^2$.

The active pixel sensor 60 in the above-mentioned preferred embodiment is positioned on a silicon substrate 62 with P-type dopants. If the silicon substrate 62 is an N-type silicon substrate, the metal-oxide semiconductor positioned on it would be a PMOS, and the two doping areas in the photosensing area would be doping areas with P-type dopants. Additionally, the APS transistor 86 may be replaced by a CMOS transistor.

Figure 7:
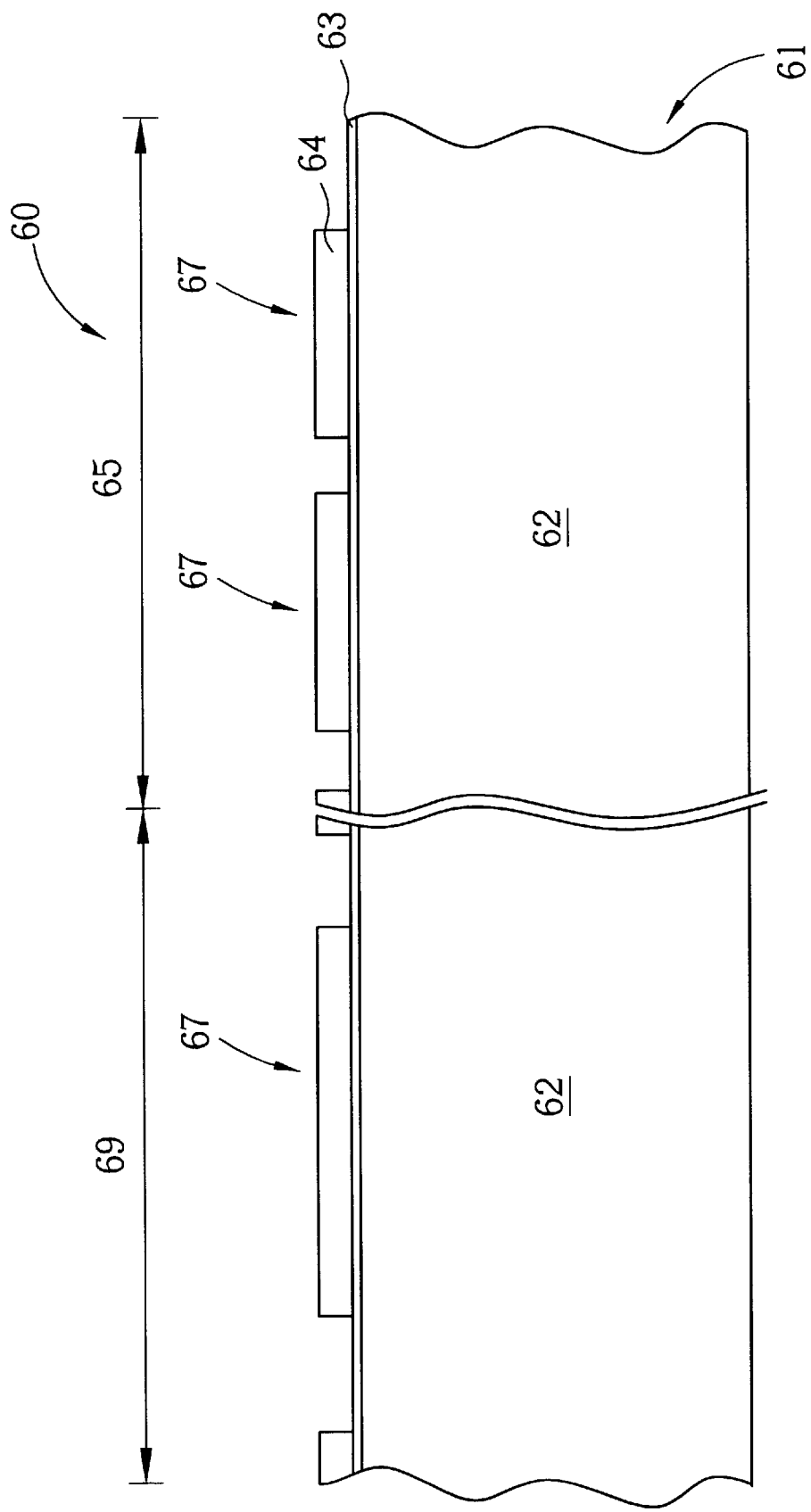
FIG. 7 to FIG. 14 are schematic diagrams of forming a present invention active pixel sensor.

Please refer to FIG. 7 to FIG. 14. FIG. 7 to FIG. 14 are schematic diagrams of the fabrication process for the present invention active pixel sensor 60. In the following description, a semiconductor wafer 61 having a silicon substrate 62 with P-type dopants is taken as an example to illustrate the fabrication process of the photosensing area 70 in the present invention active pixel sensor 60. As shown in FIG. 7, the method for forming the photosensing area 70 in the active pixel sensor 60 according to the present invention involves first cleaning the semiconductor wafer 61 having a P-type substrate 62. The semiconductor wafer 61 is then placed in a furnace to perform a thermal oxidation method in an oxygen environment to form a silicon oxide layer 63 with a thickness of several hundreds angstroms on the surface of the silicon substrate 62. The silicon oxide layer 63 is used as a sacrificial oxide layer in a subsequent ion implantation process to enhance the scattering of implanted ions so that channeling is inhibited.

A chemical vapor deposition (CVD) process is used to deposit a silicon nitride ($Si_3N_4$) layer 64 with a thickness from 1000 to 2000 angstroms. Thereafter, a first photolithography process is performed to define the active area 67 of the CMOS transistors in the periphery circuit area 65, and the active area 67 of the pixel sensor cell in the active pixel sensor region 69. A dry etching process is then performed to remove the silicon nitride layer 64 not covered by the photoresist layer. Finally, the photoresist layer is removed.

Figure 8:
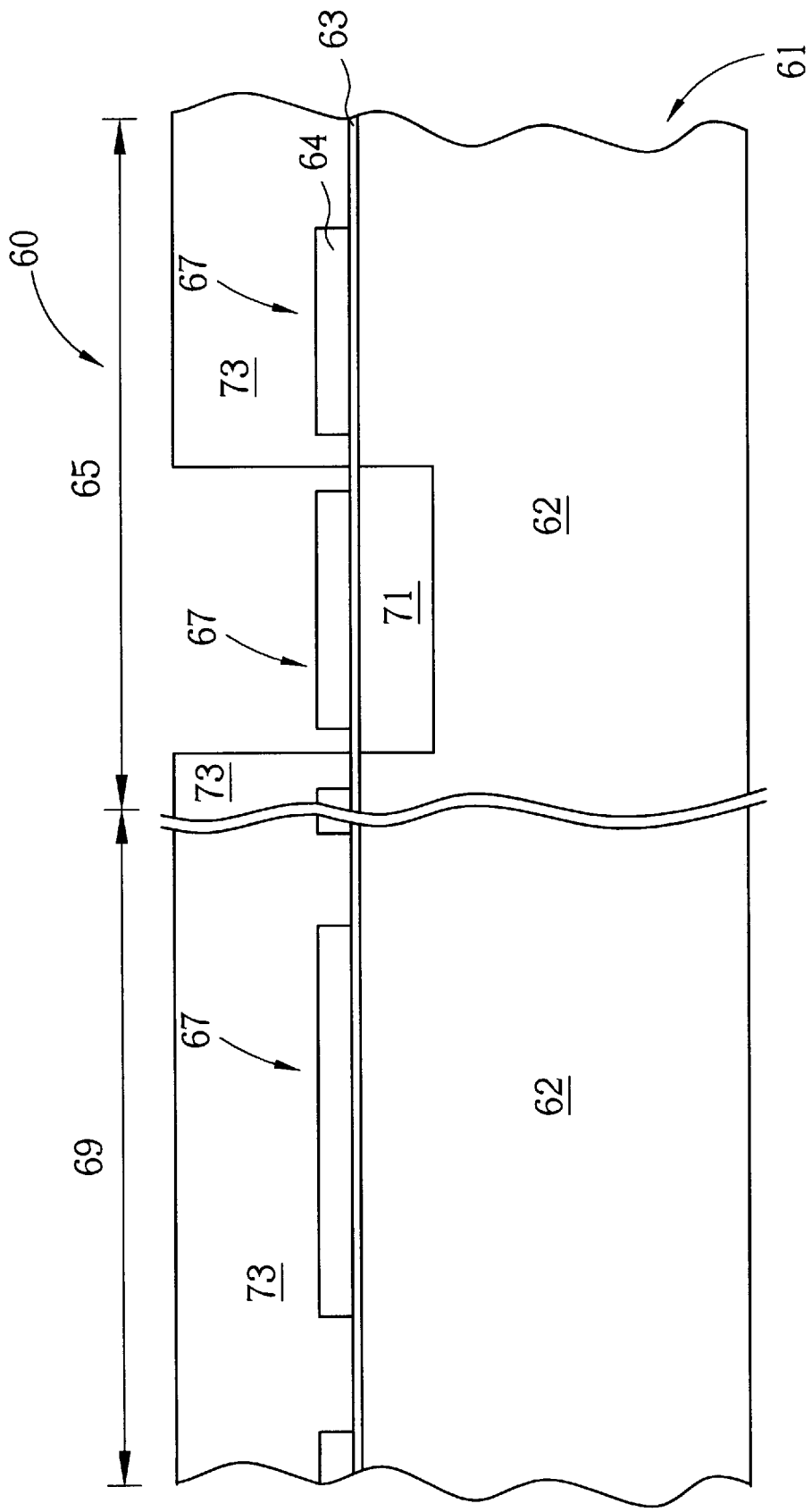

As shown in FIG. 8, an active pixel sensor block mask (APSB mask) is utilized to define the N-well region of a PMOS transistor in the periphery circuit area 65, and to cover other regions in the periphery circuit area 65 and the whole active pixel sensor region 69 with a photoresist layer 73. Thereafter, a first ion implantation process is performed utilizing phosphorous (P) ions as dopants with a dosage of $10^{13}/cm^2$ to form at least one N-well 71.

Figure 9:
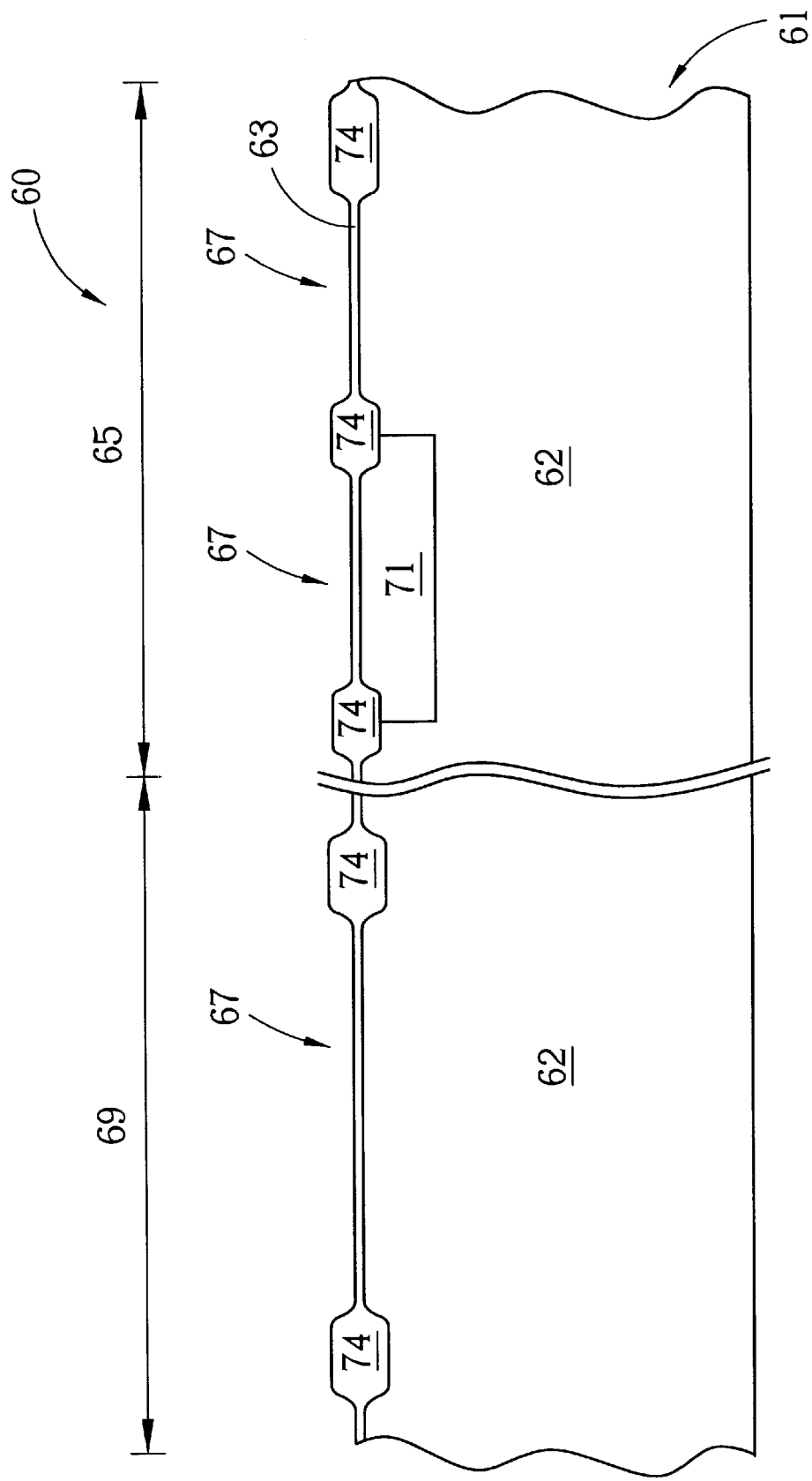

As shown in FIG. 9, the photoresist layer 73 is removed. A field oxide layer (FOX layer) 74 is then formed on the semiconductor wafer 61 to isolate subsequently formed NMOS and PMOS devices, and to isolate the APS transistor, by utilizing the silicon nitride layer 64 remaining on the semiconductor wafer 61 as a mask in a local oxidation (LOCOS) process. The silicon nitride layer 64 is then removed with a wet etching method by utilizing hot phosphoric acid ($H_3PO_4$) as an etching solution. Before forming the field oxide layer 74, a P-type ion implantation process can be performed on the surface of the wafer by utilizing a photoresist to cover the PMOS transistor (not shown) in the periphery circuit area and the active pixel sensor region, to form a channel stop (not shown) at either side of the NMOS transistor.

Figure 10:
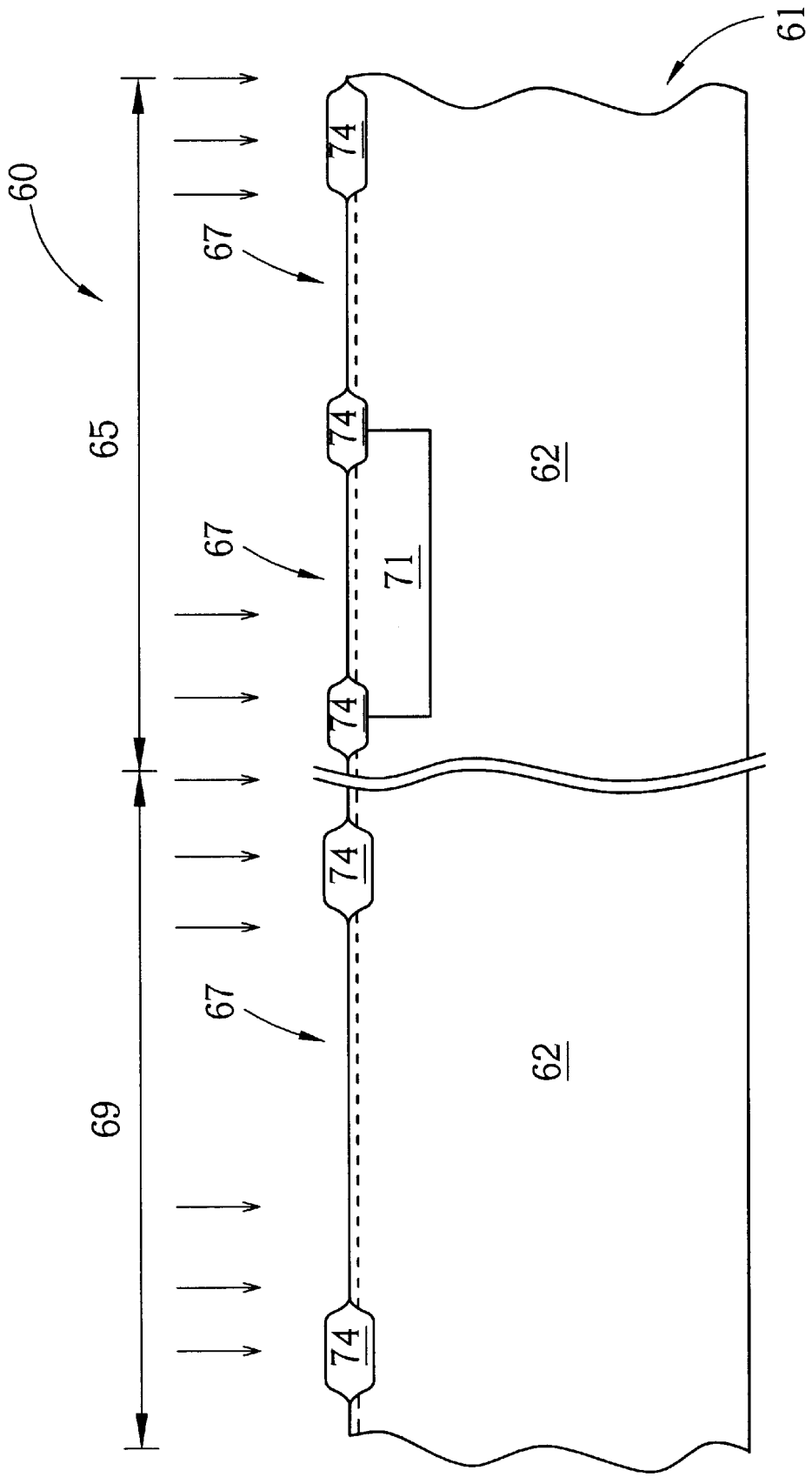

As shown in FIG. 10, the silicon oxide layer 63 is completely removed and a second ion implantation process is performed to the surface of the semiconductor wafer 61 to adjust the threshold voltage of the active area 67. The second ion implantation process utilizes three valence boron or $BF_2^+$ as dopants with a dosage of $10^{12}/cm^2$, and the implantation energy is in several tens of KeV.

Figure 11:
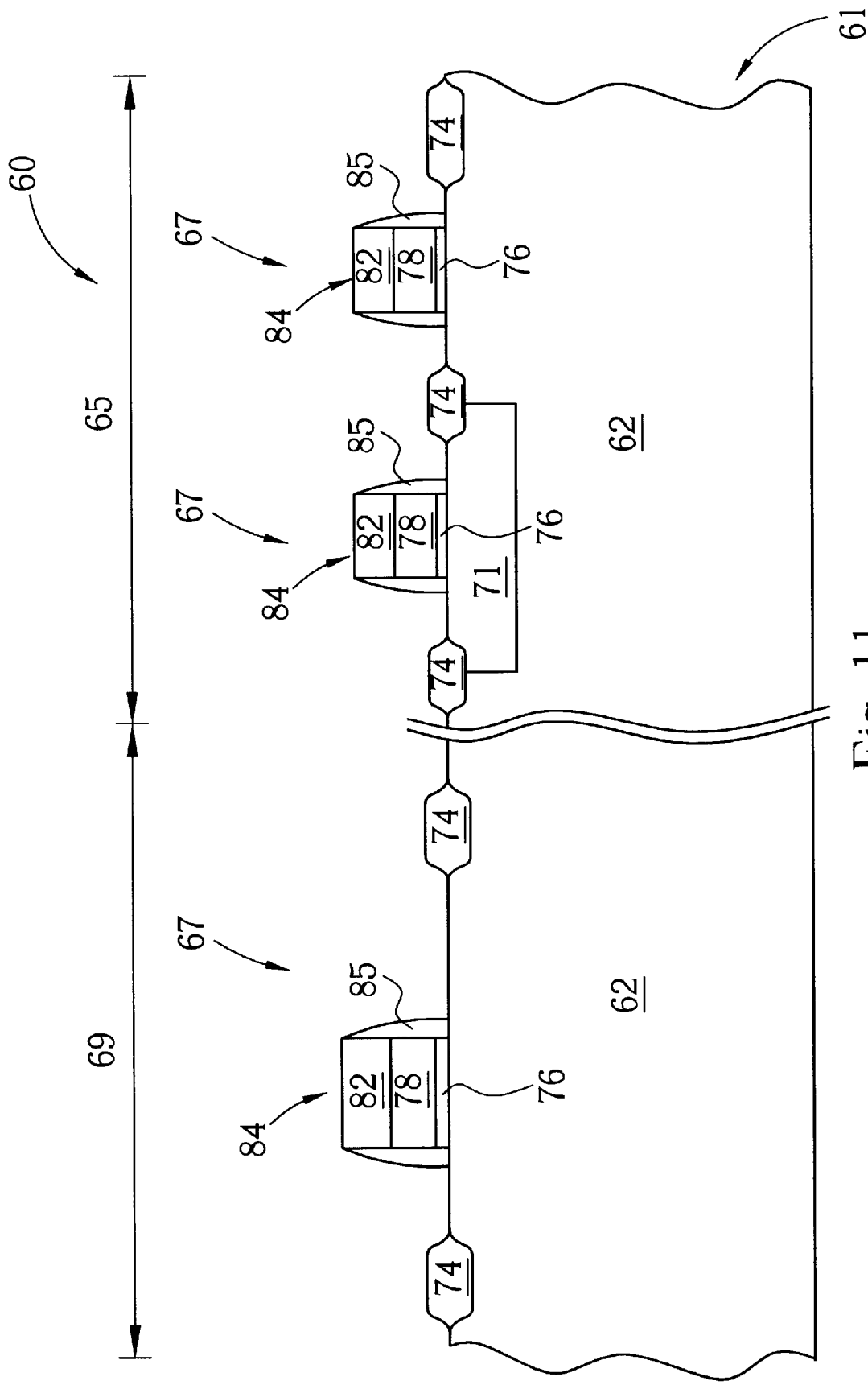

As shown in FIG. 11, a dry oxidation process is performed, utilizing a furnace to form a gate oxide layer 76 on the semiconductor wafer 61. A polysilicon layer 78 is then formed on the surface of the gate oxide layer 76 by utilizing a low pressure chemical vapor deposition process. Thereafter, an ion implantation process is performed to dope the polysilicon layer 78. Next, a low pressure chemical vapor deposition process is utilized to form a metal silicide layer 82 on the surface of the polysilicon layer 78. A photolithography and etching process is performed to form the gate 84 of each NMOS, each PMOS and each APS transistor. A spacer 85 at either side of each gate is then formed by utilizing the deposition of a dielectric layer and selectivity in a dry etching process.

Figure 12:
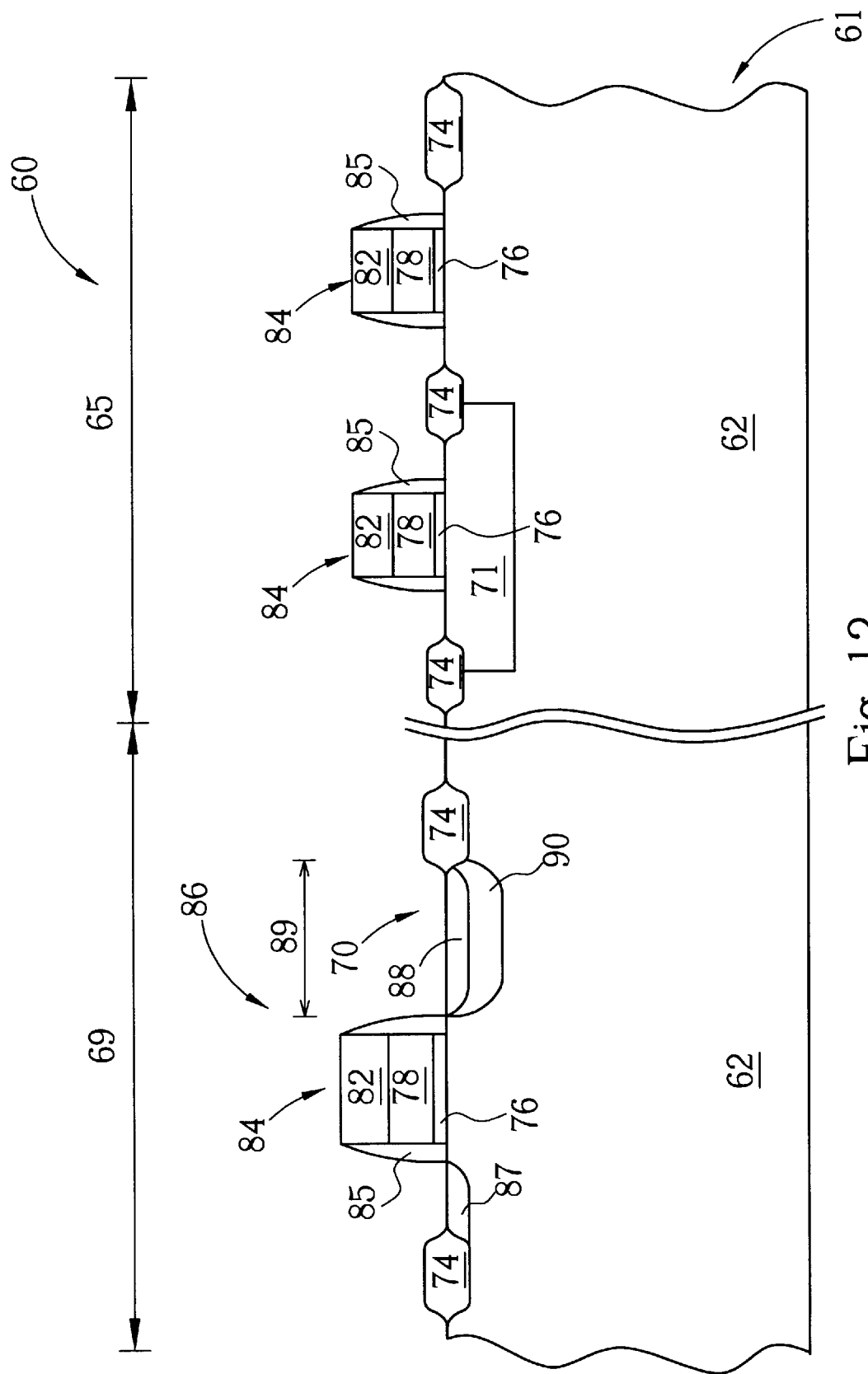

As shown in FIG. 12, two different photolithography and ion implantation processes are used to complete the fabrication process of the APS transistor 86 in the active pixel sensor region 69. First, a third photolithography process is performed to define the photodiode region 89 by utilizing a sensor mask. Then, a third ion implantation process is performed, that is, an $N^-$ ion implantation process is performed to the photodiode region 89 by utilizing phosphorous ions as dopants with a dosage of $10^{12}/cm^2$ to form the sensor implantation area 90. The photosensing area 70 is on top of the photodiode region 89. A fourth photolithography process and a fourth ion implantation process is then performed. That is, an $N^+$ ion implantation process is performed to the APS transistor 86 in the active pixel sensor region 69, utilizing phosphorous ions as dopants with a dosage of $10^{14}/cm^2$, to form the source/drain (S/D) 87, 88 of the APS transistor 86. In these two ion implantation processes, the dosage for the $N^-$ ion implantation process is lower than the $N^+$ ion implantation process, but the implantation depth for the $N^-$ ion implantation process is deeper than the $N^+$ ion implantation process. The process sequence of the $N^-$ ion implantation process and the $N^+$ ion implantation process can be exchanged.

Figure 13:
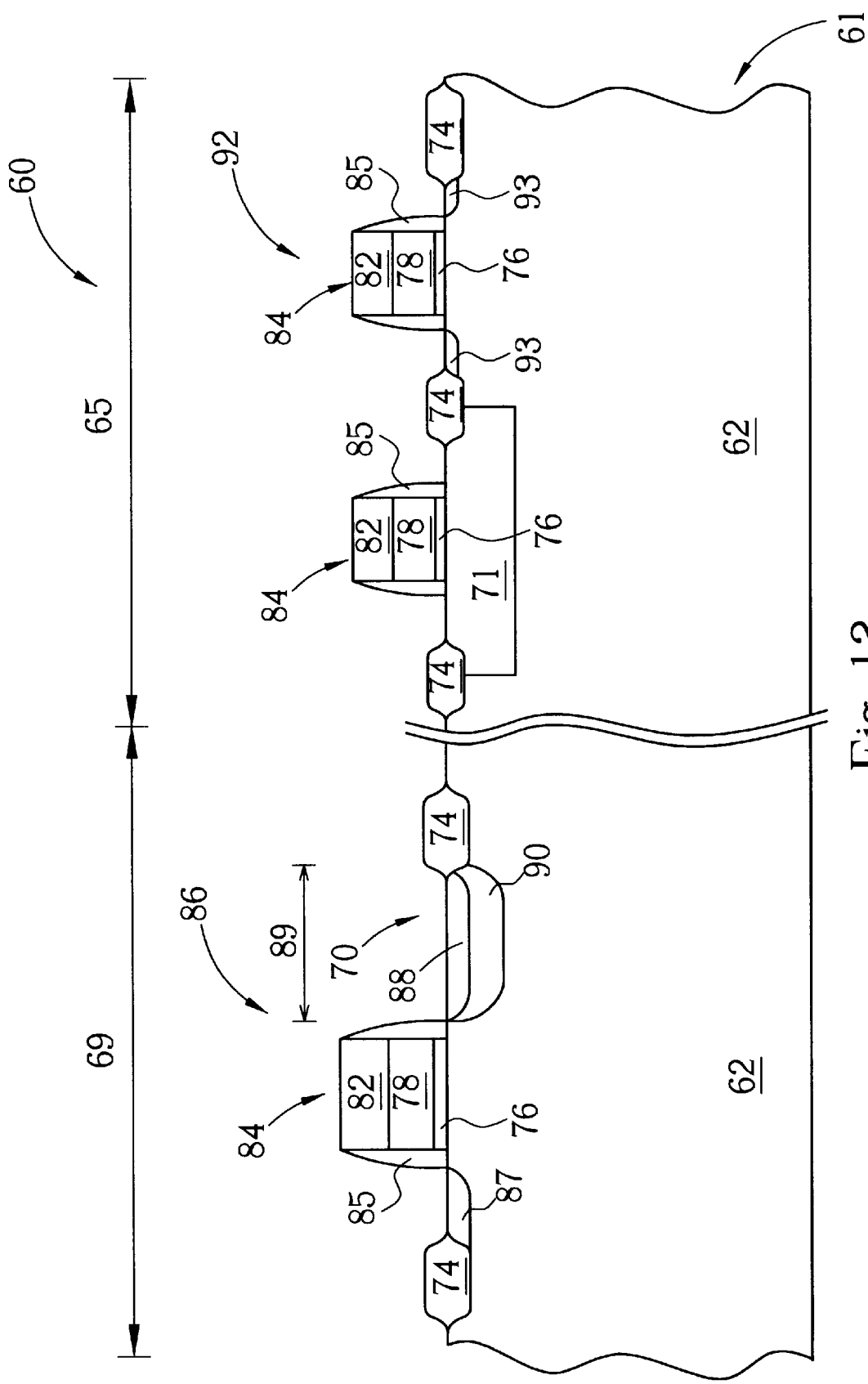

As shown in FIG. 13, a fifth photolithography and fifth ion implantation process is performed. That is, an $N^+$ ion implantation process is performed to the NMOS transistor 92 in the periphery circuit area 65 to form the source/drain 93 of the NMOS transistor 92, and to complete the fabrication process of the NMOS transistor 92 in the periphery circuit area 65. Before or after the formation of the source/drain 93 of the NMOS transistor 92, an angled ion implantation process can be performed to form a lightly doped drain (LDD) (not shown) of the NMOS transistor 92. The lightly doped drain of the NMOS transistor 92 may also be formed before the formation of the spacer 85.

Figure 14:
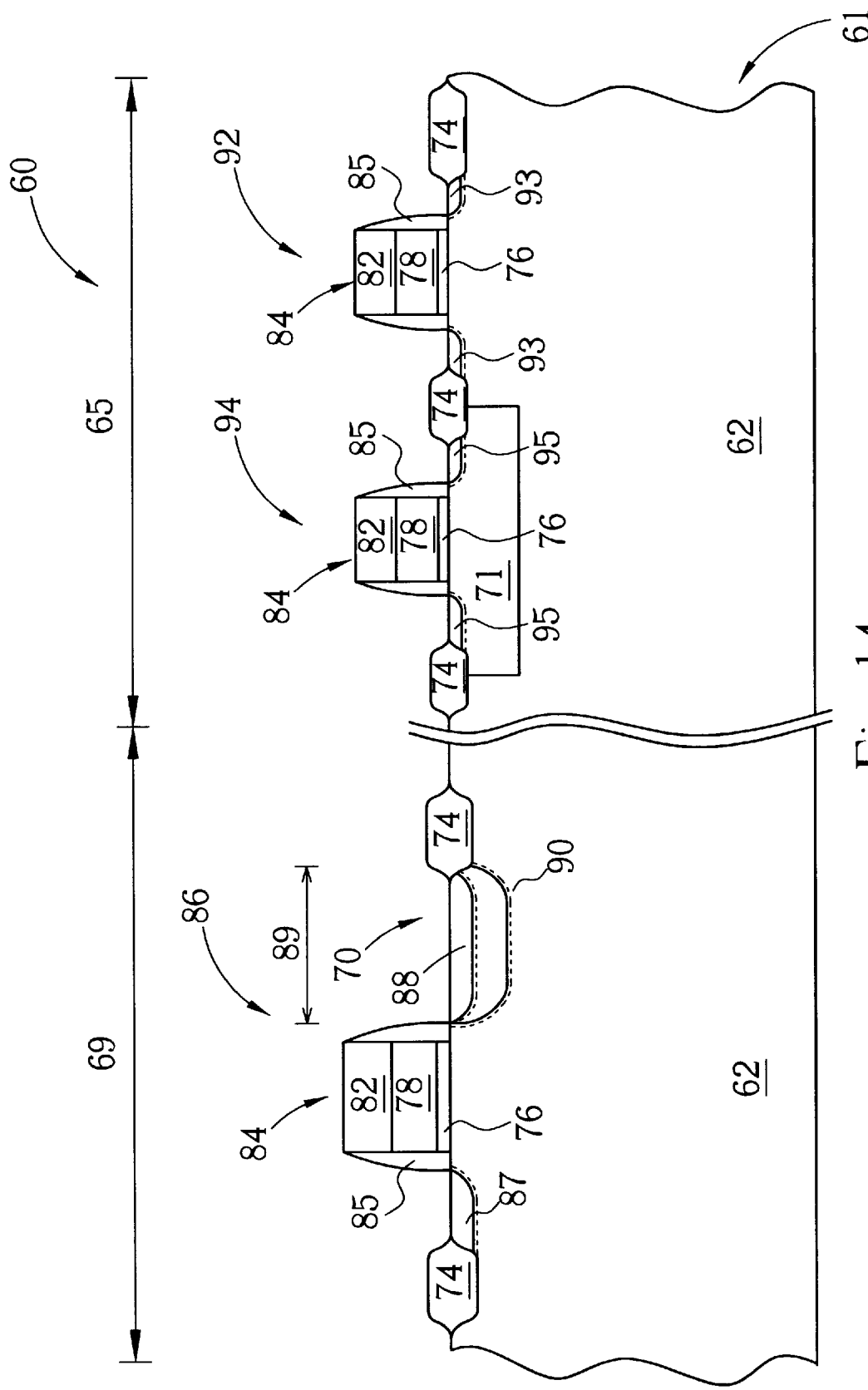

As shown in FIG. 14, a sixth photolithography and ion implantation processes performed. That is, a P$^+$ ion implantation process is performed to the PMOS transistor 94 in the periphery circuit area 65 to form the source/drain 95 of PMOS transistor 94, and complete the fabrication process of PMOS transistor 94 in the periphery circuit area 65. Finally, a drive-in process is performed at a temperature of approximately 850° C., utilizing a furnace, to drive the dopants in the source/drain 87, 88 of the APS transistor 86, the dopants in the source/drain 93 of NMOS transistor 92, and the dopants in the source/drain 95 of PMOS transistor 94 and the sensor implantation 90 in the photodiode region 89 down to a predetermined depth (as shown by the dotted line). The fabrication process of the APS transistor 86 and the CMOS transistors in the periphery circuit area 65 is then finished.

The method for making the photosensing area 70 in the active pixel sensor 60 according to the present invention avoids any P-well surrounding the photosensing area 70. Therefore, not only is the wafer structure destruction problem caused by two high-energy ion implantation processes avoided, but also the P-well encroachment phenomenon does not occur in the subsequent high temperature drive-in process. The actual area of photodiode is not shrunk, and non-uniformity of the sensor area of the photosensing area of the different photo diode does not occur. This clearly improves mismatching between different photodiodes. Since there are fewer defects in the wafer structure, the leakage current is lower, and noise is reduced. Furthermore, the source/drain shares the same area with the photodiode region in the present invention structure. That is, the drain, with a higher doping concentration, does not join with the P-type substrate. Only the sensor implantation region having a lower doping concentration directly joins with the P-typo substrate. Therefore, the width of the depletion region of the present invention photo diode is wider, and the absorption range is larger.

Briefly speaking, the present invention forms a first active pixel sensor block mask (APSB mask) to cover the active pixel sensor region first, then forms at least one first type well on the surface of the semiconductor wafer not covered by the first APSB mask. Thereafter, the first APSB mask is removed, and a second APSB mask and at least one first type well mask are formed on the surface of the semiconductor wafer to cover the active pixel sensor region and the region outside a second type well in the periphery circuit region, respectively. At least one second type well is then formed on the surface of the semiconductor wafer not covered by the second APSB mask and the first type well mask. Finally, the second APSB mask and the first type well mask are removed, and at least one photodiode and at least one complementary metal-oxide semiconductor (CMOS) transistor are formed on the surface of the active pixel sensor region.

In summary, the present invention utilizes the first APSB mask and the second APSB mask to avoid the formation of the first type well and the second type well in the active pixel sensor region, and so the quantum efficiency (QE) of the photodiode is raised. For instance, the QE of the present invention photodiode is raised to more than 60% under 550 nm incident light.

In contrast to the prior art method of forming a photosensing area in an active pixel sensor, the photosensing area of the present invention photodiode is not surrounded by a P-well. There are thus fewer defects in wafer structure. Leakage current is lowered, and noise is reduced. Also, non-uniformity of the sensor areas of the photosensing area of different photodiodes shows clear improvement, which further enhances image quality.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for making a plurality of active pixel sensors on a surface of a semiconductor wafer, the semiconductor wafer comprises a P-type substrate, an active pixel sensor region, and a periphery circuit region, the method comprising:

forming a first active pixel sensor block mask (APSB mask) on the surface of the semiconductor wafer by performing a first photolithography process to cover the active pixel sensor region;

performing a first ion implantation process to form at least one first type well on the surface of the semiconductor wafer not covered by the first active pixel sensor block mask;

removing the first active pixel sensor block mask;

forming a second active pixel sensor block mask (APSB mask) and at least one first type well mask on the surface of the semiconductor wafer by performing a second photolithography process to cover the active pixel sensor region and the region outside a second type well in the periphery circuit region, respectively;

performing a second ion implantation process to form at least one second type well on the surface of the semiconductor wafer not covered by the second active pixel sensor block mask and the first type well mask;

removing the second active pixel sensor block mask and the first type well mask;

forming a sensor mask on the surface of the semiconductor wafer by performing a third photolithography process to define a photodiode region in the active pixel sensor region;

performing a third ion implantation process to form at least one sensor implantation region on the surface of the semiconductor wafer not covered by the sensor mask;

removing the sensor mask;

forming a source/drain mask on the surface of the semiconductor wafer by performing a fourth photolithography process to expose at least one source/drain region in the active pixel sensor region;

performing a fourth ion implantation process to form at least one source/drain region on the surface of the semiconductor wafer not covered by the source/drain mask to form at least one photodiode and at least one metal-oxide semiconductor (MOS) transistor of a complementary metal-oxide semiconductor (CMOS) transistor on the surface of the active pixel sensor region; and removing the source/drain mask;

wherein the third ion implantation process and the fourth ion implantation process are both N-type ion implantation processes, the dosage for the third ion implantation is lower than the dosage for the fourth ion implantation, the implantation depth for the third ion implantation process is deeper than the fourth ion implantation process, the drain does not join with the P-type substrate, and the sensor implantation region joins with the P-type substrate.

2. The method of claim 1 wherein the first photolithography process further forms at least one second type well mask to cover a region outside the first type well in the periphery circuit region.

3. The method of claim 1 wherein the method further comprises forming a plurality of isolation layers to isolate each photodiode and each CMOS transistor.

4. The method of claim 3 wherein the plurality of isolation layers comprise a field oxide layer (FOX) or a shallow trench isolation (STI) structure.

5. The method of claim 1 wherein the first active pixel sensor block mask and the second active pixel sensor block mask are used to avoid formation of the first type well and the second type well in the active pixel sensor region so as to improve a quantum efficiency (QE) of the photo diode.

6. The method of claim 1 wherein the first type well is an N type well and the second type well is a P type well.

7. The method of claim 1 wherein the first type well is a P type well and the second type well is an N type well.

8. A method for making an active pixel sensor on a surface of a semiconductor wafer, a substrate of the semiconductor wafer comprising an active pixel sensor region and a periphery circuit region, the periphery circuit region being used to form a plurality of complementary metal-oxide semiconductor (CMOS) devices comprising an N-type channel metal oxide semiconductor (NMOS) device and a P-type channel metal-oxide semiconductor device, the active pixel sensor region being used to form a plurality of active pixel sensor transistors (APS transistors) and a plurality of photodiodes, the method comprising:

forming a silicon dioxide ($SiO_2$) layer and a silicon nitride ($Si_3N_4$) layer on the surface of the semiconductor wafer;

performing a first photolithography process to define an active area of the CMOS devices in the periphery circuit region, and an active area of a pixel sensor cell in the active pixel sensor region;

performing an etching process to remove the silicon nitride layer not covered by a photoresist layer formed by the first photolithography process;

forming an active pixel sensor block mask (APSB mask) to define an N-well region for making PMOS devices in the periphery circuit region, to cover another region in the periphery circuit region, and to completely cover the active pixel sensor region;

performing a first ion implantation process to form a plurality of N-wells on the surface of the semiconductor wafer;

forming a plurality of field oxide (FOX) layers on the semiconductor wafer to isolate the NMOS devices, the PMOS devices, and the pixel sensor cell;

performing a second ion implantation process to adjust a threshold voltage of the active areas;

forming a gate and a spacer of each NMOS device, each PMOS device, and each APS transistor;

forming a sensor mask by performing a third photolithography process to define a photodiode region, the photodiode region being the same region as a drain of the APS transistor;

performing a third ion implantation process to perform an N⁻ sensor implantation process to the photodiode region;

performing a fourth photolithography process to expose the APS transistor in the active pixel sensor region;

performing a fourth ion implantation process to form a source/drain (S/D) of each APS transistor in the active pixel sensor region;

performing a fifth photolithography process to expose the NMOS devices in the periphery circuit region;

performing a fifth ion implantation process to form a source/drain (S/D) of each NMOS device in the periphery circuit region;

performing a sixth photolithography process to expose the PMOS devices in the periphery circuits region and to cover another portion of the periphery circuit region and the active pixel sensor region;

performing a sixth ion implantation process to form a source/drain (S/D) of each PMOS device in the periphery circuit region; and performing a high temperature activation process to drive-in dopants in each source/drain and the photodiode region to complete the APS transistor and the CMOS devices.

9. The method of claim 8 further comprising a channel stop process performed before the field oxide process, the channel stop process comprising:

performing a photolithography process to form a patterned photoresist layer covering the PMOS devices in the periphery circuit region and the active pixel sensor region;

performing a P-type ion implantation process to the surface of the semiconductor wafer to form a channel stop in a periphery of a predetermined region for NMOS devices; and removing the patterned photoresist layer.

10. The method of claim 8 wherein the method for forming the field oxide layer comprises:

performing a wet oxidation process by utilizing a furnace to form a field oxide layer on the semiconductor wafer not protected by the silicon nitride layer; and performing a wet etching process to strip the silicon nitride layer on the semiconductor wafer.

11. The method of claim 8 wherein the method for forming a gate for each NMOS device and PMOS device on the semiconductor wafer comprises:

performing a dry oxidation process by utilizing a furnace to form a gate oxide layer on the semiconductor wafer;

performing a low pressure chemical vapor deposition process to form a polysilicon layer atop the gate oxide layer;

performing an ion implantation process to dope the polysilicon layer;

forming a metal silicide layer on a surface of the polysilicon layer;

performing a photolithography process to define a gate pattern for each CMOS device and each APS transistor;

performing an etching process to remove the metal silicide layer, the doped polysilicon layer, and the gate oxide layer not covered by a photoresist layer formed in the photolithography process; and removing the photoresist layer.

12. The method of claim 8 further comprising an angled ion implantation process to form a lightly doped drain (LDD) in each MOS device.

13. A method for making an active pixel sensor on a surface of a semiconductor wafer, a substrate of the semiconductor wafer comprising an active pixel sensor region and a periphery circuit region, the periphery circuit region being used to form a plurality of complementary metal-oxide semiconductor (CMOS) devices comprising an N-type channel metal oxide semiconductor (NMOS) device and a P-type channel metal-oxide semiconductor device, the active pixel sensor region being used to form a plurality of active pixel sensor transistors (APS transistors) and a plurality of photodiodes, the method comprising:

forming a silicon dioxide ($SiO_2$) layer and a silicon nitride ($Si_3N_4$) layer on the surface of the semiconductor wafer;

performing a first photolithography process to define an active area of the CMOS devices in the periphery circuit region, and an active area of a pixel sensor cell in the active pixel sensor region;

performing an etching process to remove the silicon nitride layer not covered by a photoresist layer formed in the first photolithography process;

forming an active pixel sensor block mask (APSB mask) to define an N-well region for making a PMOS device in the periphery circuit region, to cover another region in the periphery circuit region, and to completely cover the active pixel sensor region;

performing a first ion implantation process to form a plurality of N-wells on the surface of the semiconductor wafer;

forming a plurality of field oxide (FOX) layers on the semiconductor wafer to isolate the NMOS device, the PMOS device, and the pixel sensor cell;

performing a second ion implantation process to adjust a threshold voltage of the active areas;

forming a gate and a spacer of each NMOS device, each PMOS device, and each APS transistor;

performing a third photolithography process to expose the APS transistor in the active pixel sensor region;

performing a third ion implantation process to form a source/drain of each APS transistor in the active pixel sensor region;

forming a sensor mask by performing a fourth photolithography process to define a photodiode region, the photodiode region being the same region as a drain of an APS transistor;

performing a fourth ion implantation process to perform an N⁻ sensor implantation process to the photodiode region;

performing a fifth photolithography process to expose the NMOS device in the periphery circuit region;

performing a fifth ion implantation process to form a source/drain (S/D) of each NMOS device in the periphery circuit region;

performing a sixth photolithography process to expose the PMOS device in the periphery circuit region, and to cover another portion of the periphery circuit region and the active pixel sensor region;

performing a sixth ion implantation process to form a source/drain (S/D) of each PMOS device in the periphery circuit region; and performing a high temperature activation process to drive-in dopants in each source/drain and in the photodiode region to complete the APS transistor and the CMOS devices.

14. The method of claim 13 further comprising a channel stop process performed before the field oxide process, the channel stop process comprising:

performing a photolithography process to form a patterned photoresist layer covering the PMOS device in the periphery circuit region and the active pixel sensor region;

performing a P-type ion implantation process to the surface of the semiconductor wafer to form a channel stop in a periphery of a predetermined region for the NMOS device; and removing the patterned photoresist layer.

15. The method of claim 13 wherein the method for forming the field oxide layer comprises:

performing a wet oxidation process by utilizing a furnace to form a field oxide layer on the semiconductor wafer not protected by the silicon nitride layer; and performing a wet etching process to strip the silicon nitride layer on the semiconductor wafer.

16. The method of claim 13 wherein a method for forming a gate for each NMOS device and the PMOS device on the semiconductor wafer comprises:

performing a dry oxidation process by utilizing a furnace to form a gate oxide layer on the semiconductor wafer;

performing a low pressure chemical vapor deposition process to form a polysilicon layer atop the gate oxide layer;

performing an ion implantation process to dope the polysilicon layer;

forming a metal silicide layer on the surface of the polysilicon layer;

performing a photolithography process to define a qate pattern for each CMOS device and each APS transistor;

performing an etching process to remove the metal silicide layer, the doped polysilicon layer and the gate oxide layer not covered by a photoresist layer formed in the photolithography process; and removing the photoresist layer.

17. The method of claim 13 further comprising a seventh ion implantation process to form a lightly doped drain (LDD) in each MOS device.

* * * * *